United States Patent
Lehnert et al.

(10) Patent No.: US 9,581,104 B2
(45) Date of Patent: Feb. 28, 2017

(54) STEEL PISTON FOR AN INTERNAL COMBUSTION ENGINE AND METHOD FOR ITS PRODUCTION

(71) Applicants: Mahle International GmbH, Stuttgart (DE); Oerlikon Trading AG, Truebbach, Truebbach (CH)

(72) Inventors: Monika Lehnert, Remseck (DE); Reinhard Rose, Fellbach (DE); Juergen Ramm, Maienfeld (CH); Beno Widrig, Bad Ragaz (CH)

(73) Assignees: Mahle International GmbH (DE); Oerlikon Surface Solutions AG, Pfäffikon (CH)

( * ) Notice: Subject to any disclaimer, the term of this patent is extended or adjusted under 35 U.S.C. 154(b) by 100 days.

(21) Appl. No.: 14/516,226

(22) Filed: Oct. 16, 2014

(65) Prior Publication Data
US 2015/0107544 A1    Apr. 23, 2015

(30) Foreign Application Priority Data
Oct. 17, 2013  (DE) .................. 10 2013 221 102

(51) Int. Cl.
*B32B 15/04*   (2006.01)
*F02F 3/00*    (2006.01)
(Continued)

(52) U.S. Cl.
CPC ............ *F02F 3/0084* (2013.01); *B23P 15/10* (2013.01); *C23C 14/024* (2013.01);
(Continued)

(58) Field of Classification Search
CPC ... F02F 3/0084; F02F 3/10; F02F 3/14; C23C 14/024; C23C 14/025;
(Continued)

(56) References Cited

U.S. PATENT DOCUMENTS 3,911,891 A * 10/1975 Dowell .................. 123/669
4,466,399 A    8/1984 Hinz et al.
(Continued)

FOREIGN PATENT DOCUMENTS

DE    3134768 A1    3/1983
DE    19730884 A1   1/1999
(Continued)

OTHER PUBLICATIONS

English abstract for DE-102010052687.
(Continued)

*Primary Examiner* — Maguerite McMahon
(74) *Attorney, Agent, or Firm* — Fishman Stewart PLLC

(57) ABSTRACT

A steel piston for an internal combustion engine may include a piston crown and a protective layer disposed on the piston crown. The protective layer may include an adhesion layer of Cr or CrN, which is present on a surface of the piston crown. The protective layer may include a functional layer, which is present on the adhesion layer. The functional layer may have at least one of (i) at least one layer (A) of CrN and (ii) at least one layer (B) of CrOn in the form of $[(A)/(B)]_a$, and a may represent 1 to 100.

18 Claims, 4 Drawing Sheets

(51) Int. Cl.
  *C23C 14/02* (2006.01)
  *C23C 14/06* (2006.01)
  *C23C 28/04* (2006.01)
  *C23C 28/00* (2006.01)
  *F02F 3/14* (2006.01)
  *B23P 15/10* (2006.01)
  *F02F 3/10* (2006.01)

(52) U.S. Cl.
  CPC ........ *C23C 14/025* (2013.01); *C23C 14/0641* (2013.01); *C23C 14/0676* (2013.01); *C23C 28/042* (2013.01); *C23C 28/044* (2013.01); *C23C 28/048* (2013.01); *C23C 28/322* (2013.01); *C23C 28/347* (2013.01); *C23C 28/3455* (2013.01); *C23C 28/42* (2013.01); *F02F 3/10* (2013.01); *F02F 3/14* (2013.01); *Y10T 29/49249* (2015.01)

(58) Field of Classification Search
  CPC ............ C23C 14/0641; C23C 14/0676; C23C 28/042; C23C 28/044; C23C 28/322; C23C 28/3455; C23C 28/347; C23C 28/42; B23P 15/10
  USPC ...................................... 123/193.6, 668, 669
  See application file for complete search history.

(56) References Cited

U.S. PATENT DOCUMENTS

| | | | | |
|---|---|---|---|---|
| 4,538,562 | A * | 9/1985 | Matsui et al. | 123/90.51 |
| 5,320,909 | A * | 6/1994 | Scharman et al. | 428/472 |
| 6,149,162 | A | 11/2000 | Tanaka et al. | |
| 8,430,410 | B2 | 4/2013 | Esser et al. | |
| 2005/0028364 | A1* | 2/2005 | Issler | 29/888.042 |
| 2005/0214540 | A1 | 9/2005 | Maslar | |
| 2011/0065024 | A1 | 3/2011 | Jeon et al. | |
| 2012/0085328 | A1* | 4/2012 | Bachmann et al. | 123/668 |
| 2012/0118724 | A1 | 5/2012 | Jeon et al. | |
| 2012/0244382 | A1 | 9/2012 | Chang et al. | |
| 2013/0042845 | A1* | 2/2013 | Kennedy et al. | 123/668 |
| 2014/0208941 | A1* | 7/2014 | Ioja et al. | 92/208 |
| 2014/0216423 | A1 | 8/2014 | Mitsubayashi et al. | |

FOREIGN PATENT DOCUMENTS

| | | |
|---|---|---|
| DE | 10108834 A1 | 9/2002 |
| DE | 102007007963 A1 | 8/2008 |
| DE | 102009046281 B3 | 11/2010 |
| DE | 102010052687 A1 | 5/2012 |
| DE | 102012107398 A1 | 2/2014 |
| DE | 112011105282 T5 | 2/2014 |
| EP | 1963721 A1 | 9/2008 |
| EP | 2017366 A1 | 1/2009 |
| GB | 629235 A | 9/1949 |
| WO | WO-8808926 A1 | 11/1988 |
| WO | WO-9313245 A1 | 7/1993 |
| WO | WO-2005121403 A1 | 12/2005 |
| WO | WO-2006/125683 A1 | 11/2006 |
| WO | WO-2008/043606 A1 | 4/2008 |
| WO | WO-2010/102930 A1 | 9/2010 |

OTHER PUBLICATIONS

English abstract for DE-102012107398.
English abstract for DE-19730884.
German Search Report for DE-102013221102.3, dated Mar. 10, 2014.
English Abstract for DE 10108834.
European Search Report for EP 14184947, dated Feb. 17, 2015, 3 pp.
Search Report for EP Application No. 14184947.1, dated Jun. 25, 2015, 3 pp.

* cited by examiner

STEEL PISTON FOR AN INTERNAL COMBUSTION ENGINE AND METHOD FOR ITS PRODUCTION

CROSS-REFERENCE TO RELATED APPLICATIONS

This application claims priority to German Patent Application No. 10 2013 221 102.3, filed Oct. 17, 2013, the contents of which are hereby incorporated by reference in their entirety.

TECHNICAL FIELD

The present invention relates to a steel piston for an internal combustion engine, in particular a steel piston for an internal combustion engine which has a piston crown and a protective layer applied on the piston crown. The invention relates, furthermore, to a method for the production of such a steel piston.

BACKGROUND

In steel pistons for an internal combustion engine, in particular for diesel engines, the problem arises that the burning fuel cloud, ignited after the injection, generates a very large amount of heat. The combustion chamber bowl, which is constructed in the crown of the steel piston, is thereby subject to an intensive oxidation, typically in regions close to and/or on the upper edge of the combustion chamber bowl, i.e. the lip-like boundary region between the combustion chamber bowl and the flat upper edge of the piston crown, i.e. the bowl edge. In this oxidation, the iron in the steel is oxidised to $Fe_2O_3$ and the resulting oxides have no adhesion to the non-oxidised steel material of the piston lying therebeneath.

Through mechanical expansion/contraction processes, the oxidised layer which is formed is finally detached, with so-called scale notches being formed. Through this process, the regions which are thereby eroded become so large over the course of time that they are visible to the naked eye. Through further spreading of these scale notches into the base material of the steel piston, finally bowl edge cracks can occur, which in extreme cases can lead to a destruction of the piston. Furthermore, owing to the scale notches, the problem arises that through the corresponding change to the form of the bowl edge, disturbances of the combustion process can be brought about, and thereby the exhaust emission characteristic of the engine is impaired.

With regard to the problem described above, a method is known for example from U.S. Pat. No. 7,458,358 B2, in which a coating material is applied onto the piston crown of a piston for an internal combustion engine, which coating material has a microstructure and a porosity, wherein the coating is irradiated with a high-energy laser beam, in order to increase the density of the coating, whilst at the same time the microstructure is converted and a material connection is produced between the coating and the piston crown surface, and a portion of the coating is masked, in order to prevent an irradiation with the laser beam.

From EP 1 217 095 A1 a protective coating is known for a thermally stressed component, in particular a turbine component, for protection from corrosion and/or oxidation and/or erosion, wherein the protective coating has a single-layered or multi-layered sealing coating of an amorphous material.

In addition, from DE 197 41 800 A1 a layer system is known for coating metal substrates which are liable to corrosion with at least one intermediate layer and at least one functional layer, wherein the functional layer is a nitride, carbon nitride and/or oxynitride of at least one of the metals from the $4^{th}$ to $6^{th}$ subgroup of the periodic table, and the intermediate layer is composed of one or more metal oxides.

With the coatings and methods of the prior art, however, the above-mentioned formation of scale notches and the damage to the piston entailed therewith cannot be completely satisfactorily prevented.

SUMMARY

The present invention is therefore concerned with the problem of further improving a steel piston of an internal combustion engine with regard to the above-mentioned problem.

This problem is solved according to the invention by the subjects of the independent claims. Advantageous embodiments are the subject of the dependent claims.

The present invention is based on the general idea of applying a protective layer onto the piston crown of a steel piston, which protective layer contains an adhesion layer and a functional layer applied thereon, wherein the functional layer contains a plurality of specific layers of metal nitrides, —oxides or respectively—oxynitrides, as is indicated in Claims 1 and 5.

In particular, according to a first embodiment, the protective layer contains a) an adhesion layer of Cr or CrN, which is present on the surface of the piston crown, and b) a functional layer, which is present on the adhesion layer, wherein the functional layer has, if applicable, one or more layers (A) of CrN and one or more layers (B) of CrON in the form of $[(A)/(B)]_a$, wherein a=1 to 100. In a special modification of the first embodiment, the functional layer can also have only one CrON layer, i.e. a=1 and (A) is not present.

The layer system according to the first embodiment prevents scaling of the piston crowns in current internal combustion engines. The layer system has the advantage, with regard to economy and process technology, that only evaporation sources which are equipped with Cr targets are required for the coating. This contributes to a higher throughput in the coating method and hence to lower production costs.

According to a second embodiment, the functional layer contains, if applicable, one or more layers (C) of AlCrO and one or more layers (C') of AlCrO, which differs from (C) in the form $[(C)/(C')]_a$, wherein a=1 to 100. In a special modification of the second embodiment, the functional layer can also have only one AlCrO layer, i.e. a=1 and (C) is not present.

The layer material AlCrO which is used according to the second embodiment can be produced, as is known, as mixed crystal in corundum structure, as is described in WO 08/043, 606 A1, and has in addition to the effect according to the invention as oxidation barrier furthermore a higher thermal stability compared with the CrON layer system according to the first embodiment. This is shown especially in that the crystal structure of the AlCrO layer also does not change at temperatures up to 1000° C., i.e. no substantial density changes occur, and accordingly no mechanical instabilities of the layer. The layer system according to the second embodiment therefore offers a solution approach in the event of the piston crowns being exposed to still higher combustion chamber temperatures in future.

In each embodiment of the layer systems, the transitions between the adhesion layer and the functional layer can be configured both abruptly and also smoothly with respect to the metal content and also to the nitrogen and oxygen content.

It was found according to the invention that with the above-mentioned specific combination of layers a thermal oxidation and hence a scale notch formation can be efficiently prevented. This is achieved by the action of heat in the presence of oxygen on the initially open-pored functional layer, which thereby converts into a closed-pored layer. Thereby, an oxidation of the steel base material of the piston can no longer take place.

In an advantageous further development of the solution according to the invention according to the first and the second embodiment, a=1, i.e. the functional layer consists of a layer (A) and a layer (B) or respectively a layer (C) and a layer (C'), so that a structure of the protective layer is produced which can be represented as adhesion layer/layer (A)/layer (B) or respectively adhesion layer/layer (C)/layer (C'). Here, Cr or CrN, preferably CrN, can be used for the adhesion layer in both embodiments.

According to a further advantageous further development of the solution according to the invention, in the case in which a=1, the layer (B) or respectively (C') is present as a gradient layer with increasing oxygen content in the direction of the surface, which faces away from the layer (A) or respectively (in the case of the second embodiment), which faces away from the adhesion layer. This has the advantage compared with a layer (B) or respectively (C'), the oxygen content of which is constant over the entire thickness of the layer, that the mechanical characteristics of the oxide layer (B) or respectively (C') can be adapted more advantageously to the layer (A) or respectively (in the case of the second embodiment) to the adhesive layer. The increase of the oxygen content with increasing layer thickness of the layer (B) or respectively (C') can be achieved in a manner known per se by successive increasing of the oxygen content during deposition of the layer (B) or respectively (C'). With regard to the method for deposition of the protective layer, reference is made to the description of the method according to the invention.

According to a further advantageous further development of the solution according to the invention, a=2 to 50, preferably 10 to 40, in particular 15 to 30. The respective deposition of a plurality of layers (A) and (B) or respectively (C) and (C') compared with the deposition of only respectively one layer (A) or respectively (B) or respectively (C) and (C') has the advantage that thereby intrinsic layer stresses can be controlled in a targeted manner and the adhesion of the layer system on the piston surface can be optimised for the thermal alternating load.

Expediently, the protective layer has a thickness of 1 µm to 15 µm, preferably of 2 µm to 12 µm, still more preferably of 4 µm to 10 µm and in particular of 5 µm to 8 µm. When the thickness of the protective layer is below 1 µm, the oxidation protection effect according to the invention can possibly not be obtained in a sufficient manner. The reason for this lies in that in the method of reactive cathodic spark evaporation (PVD) which is preferred for economic reasons, splashes can occur, which cannot be incorporated sufficiently into the layer in the case of layers which are too thin. A divergence to other methods such as filtered cathodic spark evaporation or sputtering would possibly allow smaller layer thicknesses, but would result in higher production costs, which is known to the specialist in the art. When, on the other hand, the thickness of the protective layer is more than 15 µm, it increasingly loses its capability of adapting itself to the changes in form of the substrate due to temperature. It becomes more brittle and possibly a detaching of the protective layer can occur.

According to a further advantageous further development of the solution according to the invention, the adhesion layer has a thickness of 0.1 µm to 5 µm, preferably of 1 µm to 5 µm and in particular of 1.5 µm to 4.0 µm. The lower limit of the adhesion layer thickness is determined especially in that the geometrically more poorly accessible piston crown surfaces are also to have a cohesive adhesion layer. According to experience, adhesion layer thicknesses of more than 5 µm do not contribute to any further improvement in the adhesion of the protective layer, but impair the cost effectiveness of the coating method.

Expediently, the functional layer has a thickness of 0.5 µm to 10 m, preferably of 1 µm to 8 µm, more preferably of 2 µm to 5 µm and in particular of 3 µm to 4 µm. Here, the layers (A) and (B) or respectively (C) and (C') of the functional layer can have independently respectively a thickness of 0.04 µm to 0.25 µm. According to a preferred embodiment of the present invention, the layers (A) and (B) or respectively (C) and (C') of the functional layer have respectively the same thickness.

According to a further advantageous further development of the solution according to the invention, the protective layer is only present on the bowl edge of the piston crown. As the formation of scale notches occurs in particular in the region of the bowl edge, a correspondingly effective protection of the piston according to the present further development can be achieved particularly economically.

The present invention provides in addition a method for the production of a steel piston for an internal combustion engine according to the above description, which has the steps: Provision of a steel piston, which has a piston crown, and application of a protective layer, as is defined above, onto the piston crown, in particular only onto the bowl edge of the piston crown, by means of a PVD method.

Expediently any steel piston for an internal combustion engine which is known to the specialist in the art, preferably a steel piston for a diesel engine, can be used as the steel piston which is to be coated by the method according to the invention.

In particular, a steel piston which is used in the commercial vehicle field (heavy duty, medium duty) or respectively in the passenger car diesel field (HSD=high speed diesel) is used as the steel piston which is to be coated. The typical passenger car piston diameters lie in the range of 75 to 90 mm, whereas in the MD/HD range, diameters of between 105 mm and approximately 160 mm are used. The base materials which are used come from the field of AFP ferrous materials, e.g. 39MnVS6, or other more highly temperature-resistant steels, such as e.g. 42CrMo4. The construction of the piston bowl can be relatively simple with a defined radius and adjoining undercut—depending on the piston type or respectively on existing thermodynamic constraints. This bowl can also possibly be constructed as a stepped bowl.

Preferred example embodiments of the invention are illustrated in the drawings and are explained in further detail in the following description.

BRIEF DESCRIPTION OF THE DRAWINGS

There are shown here, respectively diagrammatically.

DETAILED DESCRIPTION

Figure 1:
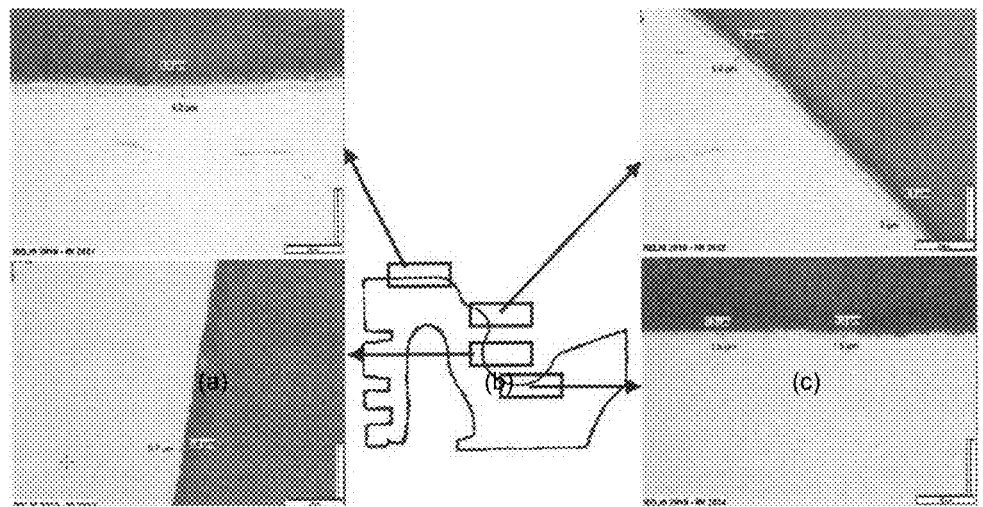
FIG. 1 a coating, applied according to Example 1, in deposition state.

An example is described in detail below for the application of the protective layer according to the invention onto a piston crown by means of a known PVD method.

As example for a PVD method, a coating process is described below, which is based on reactive cathodic spark evaporation. This is not, however, to be understood as a restriction to solely this PVD method. Other PVD methods, such as for example sputtering, electron beam evaporation or laser ablation can be used for coating, which, however, have a lower cost effectiveness and require a greater technical effort in the monitoring of the coating process.

Firstly, the substrates (pistons) which are to be coated are introduced into the rotatable mounts, provided for this, of a vacuum coating plant. The vacuum coating plant is then evacuated to a pressure of approximately $10^{-4}$ mbar.

To set the process temperature, a low-voltage arc plasma (LVA), supported by radiation heating, is ignited between a hot cathode and the anodically connected workpieces in an argon-hydrogen atmosphere.

In this process, the following parameters were set:

| | |
|---|---|
| Discharge current LVA | 110 A |
| Argon flow | 50 sccm |
| Hydrogen flow | 300 sccm |

Under these conditions, a process pressure of $1.4 \times 10^{-2}$ mbar occurs. The heating devices and the LVA were regulated so that a substrate temperature of ≤230° C. was maintained. The process duration of this pre-treatment step was 100 min.

As the next process step, the etching of the substrate surfaces takes place, in order to free the substrate surfaces of any impurities which may be present. For this, the LVA is operated between the hot cathode and an auxiliary anode provided in the coating plant. Here, a DC- a pulsed DC- or a MF- or RF supply, operated with alternating current, can be applied between the substrates and the earth. Preferably, however, the workpieces are acted upon with a negative bias voltage.

For this pre-treatment step, the following process parameters were set:

| | |
|---|---|
| Argon flow | 60 sccm |
| Discharge current LVA | 150 A |
| Bias voltage | 60 V (DC) |

Under these conditions, a process pressure of $2.4 \times 10^{-3}$ mbar occurs in the coating system. The process parameters were selected again so that the substrate temperatures of 230° C. were not exceeded. The duration of this pre-treatment was 45 min.

In the next process step, the coating of the substrate with the CrN adhesion layer takes place. This process step was carried out with four Cr targets. Various aspects are taken into consideration in the number of targets. The coating duration can be reduced when the number of targets is increased, wherein then, however, the thermal load of the substrates increases. In the present process, likewise the 230° C. with regard to the substrate temperature should not be exceeded with the coating. The process parameters for the coating with the adhesion layer were:

| | |
|---|---|
| Nitrogen flow | regulated to 3 Pa total pressure |
| Current per Cr target | 140 A |
| DC substrate bias voltage | U = −20 V |

Thereby again substrate temperatures below 230° C. were able to be guaranteed. The duration of the process step for the application of the adhesion layer was 60 min.

Figure 4:
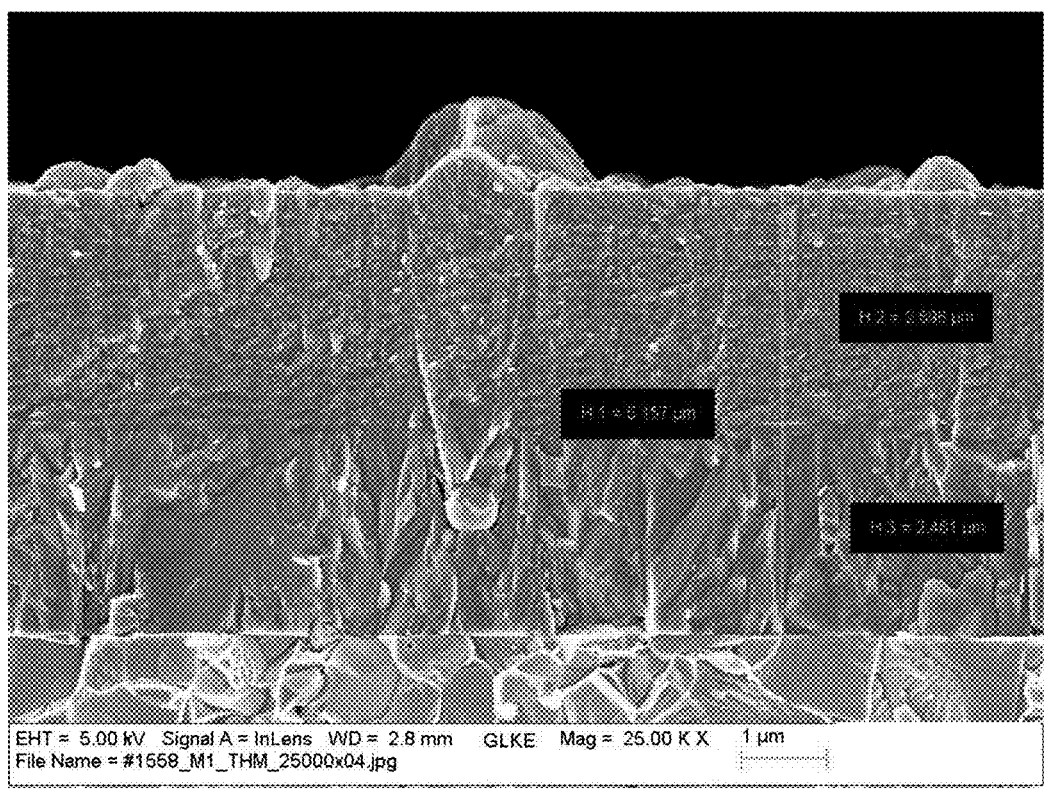

Following the coating of the substrates with the adhesion layer, the coating with the functional layer takes place. As already described above, this is particularly simple and economical in the case of the CrN—CrON multi-layered coat. The four Cr targets are continued to be operated unchanged with respectively 140 A per target. For the first CrON layer, 300 sccm oxygen is then admitted into the coating system for 2 min. Subsequently, the oxygen flow is set to zero again for 2 min, i.e. is switched off. Then the same sequence takes place as previously described: 2 min oxygen input of 300 sccm, 2 min switch-off of the oxygen flow, wherein a CrN coating is obtained. In the present process, this sequence was carried out 18 times, i.e. a total of 36 individual layers were produced. With the application of this functional layer, therefore also the application of the entire protective layer was completed. After the substrates were subsequently cooled to approximately 150° C., the coating system was vented for substrate removal. FIG. 4 shows such a protective layer, on a polished surface, however, but which was also coated during the coating of the steel pistons under identical conditions. The rupture cross-section was taken by a scanning electron microscope with a magnification of 25000×. The approximately 2.4 μm thick adhesion layer on the substrate, which consists of CrN, can be seen. In addition, the approximately 3.0 μm thick functional layer of CrN/CrON on the adhesion layer can be seen as a multi-layered coat.

In the process described above, the coating temperature was limited to 230° C. Such a limit can be expedient if, for example, the steel pistons have undergone special pre-treatments which are temperature-sensitive. If, however, the steel pistons merely have steel which permits higher temperatures, it is preferred to select somewhat higher temperatures during the coating, because then the pre-treatment steps become more effective and small cavities in the piston can be cleaned better by outgassing processes. Here, substrate temperatures of between 300° C. and 400° C. are preferred.

Figure 5:
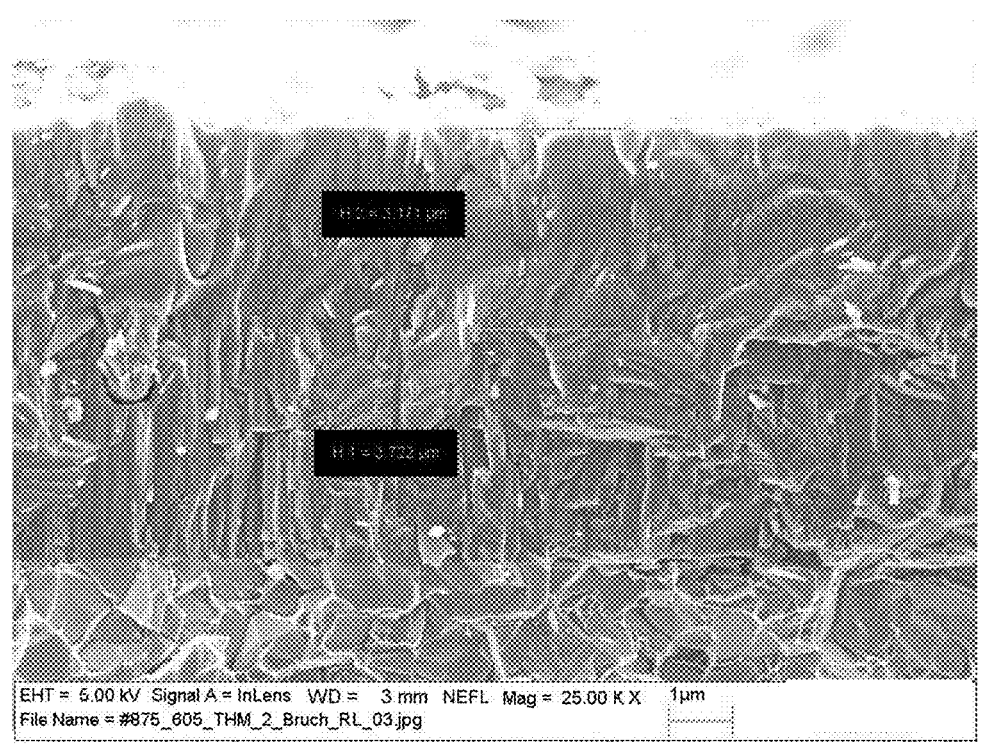

FIG. 5 shows in analogy to FIG. 4 a protective layer which consists of a CrN adhesion layer and a single AlCrO functional layer according to the second embodiment. The layer cross-section viewed in the scanning electron microscope (magnification 50000×) shows a total layer thickness of approximately 3 μm, consisting of a 1.6 μm thick CrN adhesion layer and a 1.4 μm thick AlCrO functional layer. In this case, operations were carried out with Cr targets and AlCr targets in the coating system. The pre-treatment steps corresponded to those which were already described above.

Further important features and advantages of the invention will emerge from the subclaims, from the drawings and from the associated figure description with the aid of the drawings.

It shall be understood that the features named and explained in the present application are able to be used not only in the respectively indicated combination, but also in other combinations or in isolation, without departing from the scope of the present invention.

Example 1

The bowl edge of the piston crown of a steel piston was coated by the PVD method, as has been described in detail above, firstly with a 3.9 µm thick adhesion layer of CrN and subsequently with a functional layer of 23 layers of CrN and 23 layers of CrON, which respectively had a layer thickness of approximately 0.06 µm and were applied alternately. The first layer of the functional layer applied on the adhesion layer was a CrN layer here. The total thickness of the functional layer was approximately 2.9 µm. FIG. 1 shows the obtained coating in the deposition state, wherein FIG. 1(b) shows a diagrammatic cross-section through the coated piston and FIGS. 1(a) and 1(c) show respectively microscopic micrographs of sectional areas through the steel piston according to FIG. 1(b).

The obtained coated steel piston was installed into an engine and a test run was carried out (passenger car diesel engine with steel piston, 150 kW output, 120 hours endurance test, temperature at the bowl edge approximately 600° C.). After the test run, the piston was dismantled again (cf. FIG. 2(a)) and a microscopic micrograph of a sectional area through the steel piston in the region of the bowl edge was produced, which is shown in FIG. 2(b).

Figure 2:
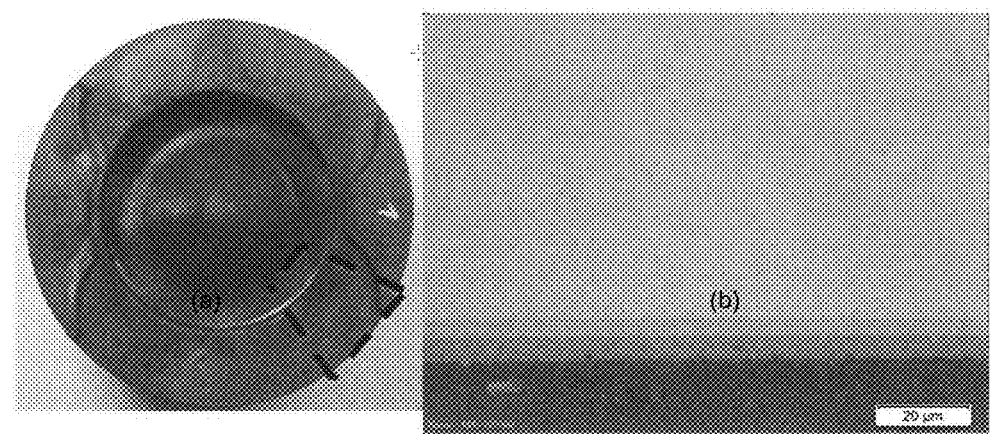
FIG. 2 a microscopic micrograph of a sectional area through a steel piston coated according to the invention, after the engine test in the region of the bowl edge according to Example 1, FIG. 3 a microscopic micrograph of a sectional area through an uncoated steel piston after the motor test in the region of the bowl edge according to the comparative example, FIG. 4 a protective layer according to the first embodiment on a polished hard metal substrate with a magnification of 25000×, and FIG. 5 a protective layer according to the second embodiment on a polished hard metal substrate with a magnification of 50000×.

As can be seen from FIG. 2(b), the protective layer applied onto the bowl edge is completely intact and the material of the steel piston shows no scale notches whatsoever. This shows that the steel piston according to the invention has an excellent resistance to damage by oxidation.

Comparative Example

The same test run as in Example 1 was carried out with the steel piston as was used in Example 1, onto which, however, no protective layer has been applied.

Figure 3:
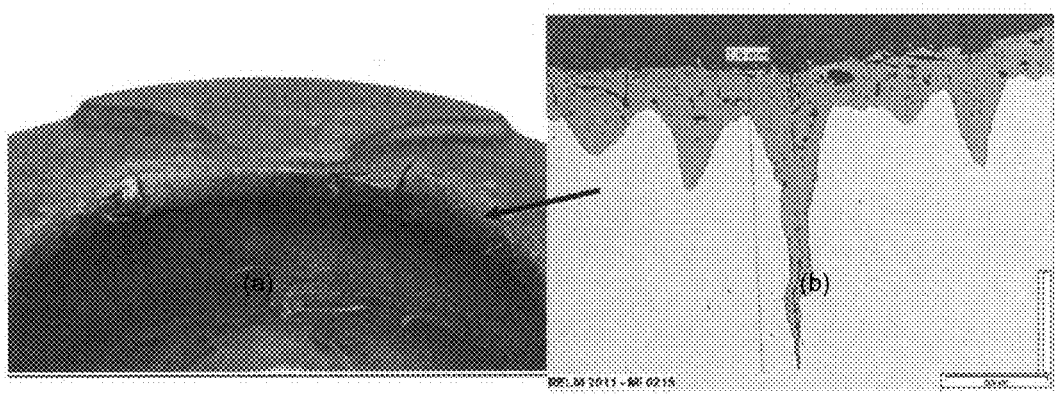

As can be seen from FIGS. 3(a) and (b), the material of the uncoated steel piston has scale notches, which leads to the disadvantages described above.

The invention claimed is:

1. A steel piston for an internal combustion engine, comprising: a piston crown and a protective layer disposed on the piston crown, wherein the protective layer includes:
   a) an adhesion layer of Cr or CrN, which is present on a surface of the piston crown, and
   b) a functional layer, which is present on the adhesion layer, wherein the functional layer has at least one of (i) a layer (A) of CrN and (ii) a layer (B) of CrON, wherein the functional layer has a layer sequence in the form of $[(A)/(B)]_a$, and wherein a=1 and the layer of (B) of CrON is present as a gradient layer with increasing oxygen content in a direction of a surface of the layer which faces away from the adhesion layer.

2. The steel piston according to claim 1, wherein the adhesion layer is CrN.

3. The steel piston according to claim 1, wherein the protective layer has a thickness of 1 µm to 15 µm.

4. The steel piston according to claim 1, wherein the adhesion layer has a thickness of 0.5 µm to 5 µm.

5. The steel piston according to claim 1, wherein the functional layer has a thickness of 0.5 µm to 10 µm.

6. The steel piston according to claim 1, wherein the layers (A) and (B) independently respectively have a thickness of 0.04 µm to 0.25 µm.

7. The steel piston according to claim 1, wherein the layers (A) and (B) respectively have the same thickness.

8. The steel piston according to claim 1, wherein the protective layer is present only on a bowl edge of the piston crown.

9. The steel piston according to claim 1, wherein the protective layer further includes a plurality of alternating layers of CrN and CrON disposed on the functional layer.

10. A steel piston for an internal combustion engine, comprising: a piston crown and a protective layer disposed on the piston crown, wherein the protective layer includes:
    a) an adhesion layer of Cr or CrN, which is present on a surface of the piston crown, and
    b) a functional layer, which is present on the adhesion layer, wherein the functional layer has at least one of (i) a layer (C) of AlCrO and (ii) a layer (C') of AlCrO', wherein the layer (C') of AlCrO' differs in oxygen content from the layer (C) of AlCrO, and wherein the functional layer has a layer system in the form of $[(C)/(C')]_a$, wherein a is a number of sequenced layers of the layer system and ranges from 1 to 100.

11. The steel piston according to claim 10, wherein a=1.

12. The steel piston according to claim 11, wherein the layer (C') of AlCrO' has a thickness of 0.04 µm to 0.25 µm.

13. The steel piston according to claim 11, wherein the layer (C') is present as a gradient layer with increasing oxygen content in a direction of a surface of the layer which faces away from the adhesion layer.

14. The steel piston according to claim 10, wherein a=2 to 100.

15. The steel piston according to claim 10, wherein at least one of (i) the adhesion layer has a thickness of 0.5 µm to 5 µm, and (ii) the functional layer has a thickness of 0.5 µm to 10 µm.

16. The steel piston according to claim 10, wherein the layers (C) and (C') each respectively have a thickness of 0.04 µm to 0.25 µm.

17. A method for producing a steel piston for an internal combustion engine, comprising the steps of:
    providing a steel piston, which has a piston crown, and
    applying a protective layer onto the piston crown via a physical vapour deposition (PVD) method, wherein applying the protective layer includes the steps of:
    applying an adhesion layer of Cr or CrN to a surface of the piston crown; and
    depositing a functional layer onto the adhesion layer, the functional layer including one of:
    (a) a layer of CrN and a layer of CrON disposed on the layer of CrN, wherein the layer of CrON is present as a gradient layer with increasing oxygen content in a direction of a surface of the layer which faces away from the adhesion layer; and
    (b) at least one of a layer of AlCrO and a layer of AlCrO', the layer of AlCrO' differing in oxygen content from the layer of AlCrO, wherein the functional layer has a layer system in the form of [AlCrO/

AlCrO']$_a$, wherein a is a number of sequenced layers of the layer system and a=1 to 100.

18. The method according to claim 17, wherein applying the protective layer via the PVD method occurs at a temperature of 150° C. to 550° C.

* * * * *